(12) United States Patent
Suh et al.

(10) Patent No.: US 10,164,170 B2
(45) Date of Patent: Dec. 25, 2018

(54) SEMICONDUCTOR DEVICE

(71) Applicants: Kiseok Suh, Hwaseong-si (KR);
Byoungjae Bae, Hwaseong-si (KR);
Gwanhyeob Koh, Seoul (KR);
Yoonjong Song, Seoul (KR); Kilho Lee, Busan (KR)

(72) Inventors: Kiseok Suh, Hwaseong-si (KR);
Byoungjae Bae, Hwaseong-si (KR);
Gwanhyeob Koh, Seoul (KR);
Yoonjong Song, Seoul (KR); Kilho Lee, Busan (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/622,064

(22) Filed: Jun. 13, 2017

(65) Prior Publication Data

US 2018/0159023 A1 Jun. 7, 2018

(30) Foreign Application Priority Data

Dec. 6, 2016 (KR) .................. 10-2016-0165205

(51) Int. Cl.
*H01L 43/02* (2006.01)
*H01L 43/08* (2006.01)
*H01L 27/22* (2006.01)

(52) U.S. Cl.
CPC ............ *H01L 43/02* (2013.01); *H01L 27/222* (2013.01); *H01L 43/08* (2013.01)

(58) Field of Classification Search
CPC ........ H01L 27/222; H01L 43/02; H01L 43/08
See application file for complete search history.

(56) References Cited

U.S. PATENT DOCUMENTS

| | | |
|---|---|---|
| 6,654,278 B1 | 11/2003 | Engel et al. |
| 6,714,446 B1 | 3/2004 | Engel |
| 6,831,855 B2 | 12/2004 | Kishi et al. |
| 6,884,633 B2 | 4/2005 | Hosotani et al. |
| 7,969,767 B2 | 6/2011 | Li et al. |
| 8,564,079 B2 | 10/2013 | Kang et al. |
| 8,865,481 B2 | 10/2014 | Li et al. |

(Continued)

FOREIGN PATENT DOCUMENTS

JP 2011171430 A 9/2011

*Primary Examiner* — Christine Enad
(74) *Attorney, Agent, or Firm* — Renaissance IP Law Group LLP

(57) ABSTRACT

A first lower interconnection structure and a second lower interconnection structure are formed using a first design rule on a first region of a substrate and a second region of the substrate, respectively. A memory element is formed on the first lower interconnection structure. The memory element includes a bottom electrode, a magnetic tunnel junction and a top electrode stacked on each other. An upper conductive line and an upper interconnection line are formed using a second design rule larger than the first design rule on the first lower interconnection structure and the second lower interconnection structure, respectively. The first lower interconnection structure, the memory element and the upper conductive line are stacked on each other so that the memory element is interposed between the first lower interconnection structure and the upper conductive line.

20 Claims, 13 Drawing Sheets

(56) References Cited

U.S. PATENT DOCUMENTS

| | | |
|---|---|---|
| 9,401,385 B2 | 7/2016 | Seo et al. |
| 2003/0156476 A1 | 8/2003 | Kishi et al. |
| 2004/0233763 A1 | 11/2004 | Hosotani et al. |
| 2005/0036362 A1* | 5/2005 | Iwata et al. .................. 365/158 |
| 2005/0275000 A1* | 12/2005 | Kajiyama et al. ............ 257/295 |
| 2007/0064472 A1* | 3/2007 | Bae et al. ..................... 365/158 |
| 2009/0261434 A1 | 10/2009 | Kang et al. |
| 2010/0054028 A1* | 3/2010 | Xia ............................... 365/158 |
| 2010/0302843 A1 | 12/2010 | Li et al. |
| 2012/0087180 A1* | 4/2012 | Mani ............................ 365/158 |
| 2014/0147941 A1 | 5/2014 | Li et al. |
| 2015/0357376 A1 | 12/2015 | Seo et al. |
| 2018/0040817 A1* | 2/2018 | Chuang ............... H01L 45/1233 |

* cited by examiner

SEMICONDUCTOR DEVICE

CROSS-REFERENCE TO RELATED APPLICATION

This application claims priority under 35 U.S.C. § 119 to Korean Patent Application No. 10-2016-0165205, filed on Dec. 6, 2016, in the Korean Intellectual Property Office, the disclosure of which incorporated by reference herein in its entirety.

TECHNICAL FIELD

The present inventive concept relates to a semiconductor device.

DISCUSSION OF RELATED ART

Embedded semiconductor devices include memory elements and logic elements integrated on a single chip. The embedded semiconductor devices include a main memory element storing user data and a functional circuit performing specific functions requested by a user.

To prevent user data from vanishing when power supplied to the embedded semiconductor devices is interrupted, the main memory element includes non-volatile memories such as FLASH memory devices or magnetic memory devices. Magnetic memory devices may operate faster than the FLASH memory devices.

SUMMARY

According to an exemplary embodiment of the present inventive concept, a semiconductor device includes a substrate, a plurality of lower conductive patterns stacked on the substrate to be vertically spaced apart from each other at a first distance, a magnetic tunnel junction provided on an uppermost lower conductive pattern of the plurality of lower conductive patterns, and an upper conductive line provided on the magnetic tunnel junction. The uppermost lower conductive pattern has a first thickness and a first width. The upper conductive line has a second thickness larger than the first thickness of the uppermost lower conductive pattern and a second width larger than the first width of the uppermost lower conductive pattern. A second distance between the upper conductive line and the uppermost lower conductive pattern is larger than the first distance.

According to an exemplary embodiment of the present inventive concept, a semiconductor device includes a substrate including a first region and a second region, a first lower conductive pattern and a first lower interconnection line provided on the first region and the second region, respectively, an upper conductive line and an upper interconnection line provided on the first lower conductive pattern and the first lower interconnection line, respectively, a magnetic tunnel junction provided between the first lower conductive pattern and the upper conductive line, and a first peripheral via plug provided between the lower first interconnection line and the upper interconnection line. The first lower conductive pattern and the first lower interconnection line have top surfaces located at substantially the same height from the substrate. Thicknesses of the upper conductive line and the upper interconnection line are larger than thicknesses of the first lower conductive pattern and the first lower interconnection line. Widths of the upper conductive line and the upper interconnection line are larger than widths of the first lower conductive pattern and the first lower interconnection line.

According to an exemplary embodiment of the present inventive concept, a method of fabricating a semiconductor device is provided as follows. A first lower interconnection structure and a second lower interconnection structure are formed using a first design rule on a first region of a substrate and a second region of the substrate, respectively. A memory element is formed on the first lower interconnection structure. The memory element includes a bottom electrode, a magnetic tunnel junction and a top electrode stacked on each other. An upper conductive line and an upper interconnection line are formed using a second design rule larger than the first design rule on the first lower interconnection structure and the second lower interconnection structure, respectively. The first lower interconnection structure, the memory element and the upper conductive line are stacked on each other so that the memory element is interposed between the first lower interconnection structure and the upper conductive line.

BRIEF DESCRIPTION OF DRAWINGS

These and other features of the present inventive concept will become more apparent by describing in detail exemplary embodiments thereof with reference to the accompanying drawings of which.

Figure 1:
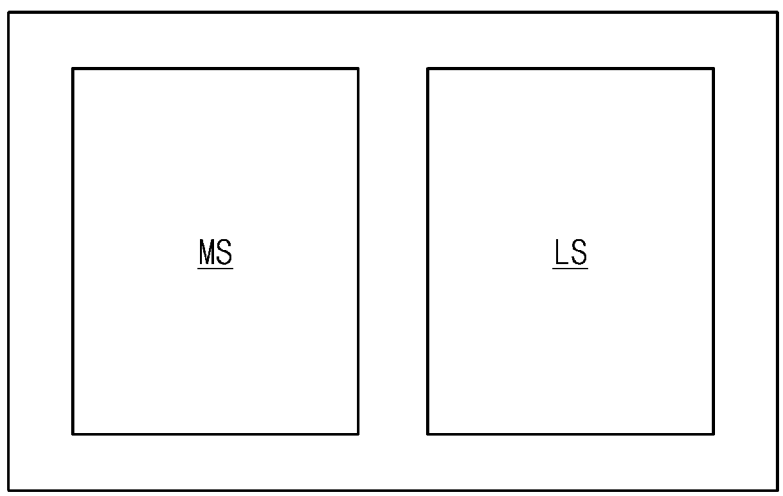
FIG. 1 is a schematic block diagram illustrating a semiconductor device according to an exemplary embodiment of the present inventive concept.

It should be noted that these figures are intended to illustrate the general characteristics of methods, structure and/or materials utilized in an exemplary embodiment and to supplement the written description provided below. These drawings are not, however, to scale and may not precisely reflect the precise structural or performance characteristics of any given embodiment, and should not be interpreted as defining or limiting the range of values or properties encompassed by a given exemplary embodiment. For example, the relative thicknesses and positioning of molecules, layers, regions and/or structural elements may be reduced or exag-

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

The values such as thickness and width of a constituent element may be expressed using "substantially the same" or "about", because the values measured in a semiconductor device fabricated according to the present inventive concept may be different from the exact value claimed below due to a process variation for forming the semiconductor device or due to an measurement error.

FIG. 1 is a schematic block diagram illustrating a semiconductor device according to an exemplary embodiment of the present inventive concept.

Referring to FIG. 1, a semiconductor device 1 may include a memory structure MS and a logic structure LS provided on a substrate. The memory structure MS may include a memory cell array. For example, the memory cell array may include a plurality of memory cells, which are two- or three-dimensionally arranged on the substrate, and a plurality of word lines, a plurality of bit lines, and a plurality of source lines, which are electrically connected to the plurality of memory cells. Each of the memory cells may include a memory element and a selection element. For example, the memory element may be a variable resistance device, whose electric resistance can be switched into one of two different values using an electric pulse applied thereto. The selection element may be configured to selectively control an electric current passing through the memory element. For example, the selection element may be or include a P-type Metal Oxide Semiconductor (PMOS) or an N-type Metal Oxide Semiconductor (NMOS) field effect transistor.

The logic structure LS may include logic circuits, which are used to perform a logical operation, or memory peripheral circuits, which are used to operate memory cells, or both. The logic circuits may include logic cells, which are used for a Boolean logic function (e.g., INVERTER, AND, OR, NAND, NOR, and so forth) or a storage function (e.g., FLIP-FLOP). The memory peripheral circuits may include a row decoder, a column selection circuit, a read/write circuit, and/or a control logic, which are used for an operation of the memory cell (e.g., a read or write operation). For example, the logic structure LS may include a plurality of Complementary Metal Oxide Semiconductor (CMOS) transistors, which constitute the logic circuits or the memory peripheral circuits, and an interconnection structure connected thereto.

Figure 2:
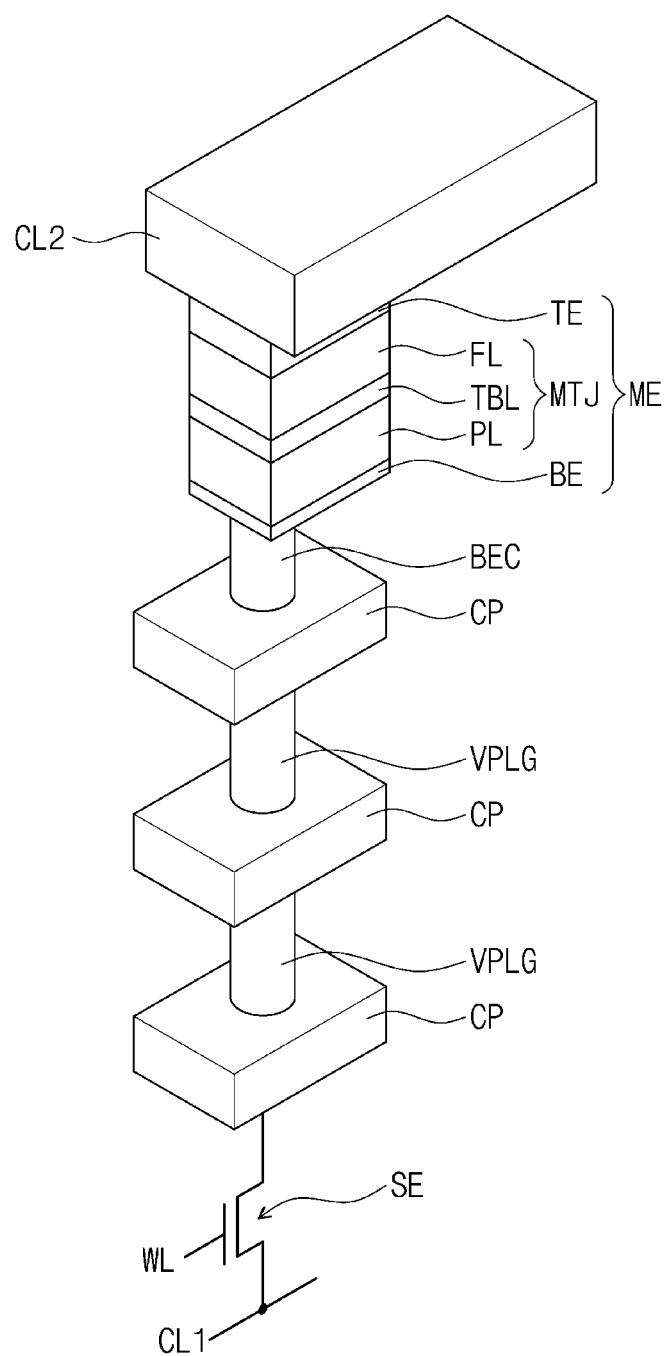
FIG. 2 is a diagram illustrating a memory cell according to an exemplary embodiment of the present inventive concept.

FIG. 2 is a diagram schematically illustrating a memory cell according to an exemplary embodiment of the present inventive concept.

Referring to FIG. 2, a memory cell may include a memory element ME and a selection transistor SE. The memory element ME may have a layered structure, whose electric resistance can by changed by a spin transfer process using an electric current passing therethrough. For example, the memory element ME may have a layered structure configured to exhibit a magneto-resistance property and may include at least one ferromagnetic material or at least one antiferromagnetic material or both. For example, the memory element ME may be a magnetic memory device including a magnetic tunnel junction MTJ.

In an exemplary embodiment, the magnetic tunnel junction MTJ may include a pinned layer PL, a free layer FL, and a tunnel barrier layer TBL interposed therebetween. The pinned layer PL may be configured to have a fixed magnetization direction, and the free layer FL may be configured to have a switchable magnetization direction (for example, parallel or antiparallel to the fixed magnetization direction of the pinned layer PL). The magnetic tunnel junction MTJ may have electric resistance that is dependent on relative magnetization directions of the pinned and free layers PL and FL. In the case where the pinned and free layers PL and FL of the magnetic tunnel junction MTJ have magnetization directions parallel to each other, the magnetic tunnel junction MTJ may have a low resistance state or a state of data '0' corresponding to a first data. In the case where the pinned and free layers PL and FL of the magnetic tunnel junction MTJ have magnetization directions antiparallel to each other, the magnetic tunnel junction MTJ may have a high resistance state or a state of data '1' corresponding to a second data.

A gate electrode of the selection transistor SE may be connected to a corresponding one of the plurality of word lines WL, a first terminal of the selection transistor SE may be connected to a first conductive line CL1, and a second terminal of the selection transistor SE may be connected to a corresponding one of second conductive lines CL2 through the magnetic tunnel junction MTJ. For example, the first conductive line CL1 may be used as a source line that is connected to a source electrode of the selection transistor SE, and the second conductive line CL2 may be used as a bit line that is connected to a drain electrode of the selection transistor SE. In an exemplary embodiment, the first and second conductive lines CL1 and CL2 may be used as the bit line and the source line, respectively.

A plurality of conductive patterns CP may be electrically connected to the second terminal of the selection transistor SE. The plurality of the conductive patterns CP may be stacked to be spaced apart from each other in a vertical direction. Vertically adjacent ones of the plurality of conductive patterns CP may be connected to each other through a via plug VPLG interposed therebetween. The memory element ME may be provided on the uppermost conductive pattern CP of the plurality of conductive patterns CP and may be connected to the uppermost conductive pattern CP through a bottom electrode contact BEC. The lowermost conductive pattern CP of the plurality of conductive patterns CP may be connected to the second terminal of the selection transistor SE through a contact plug (not shown). As shown in FIG. 2, three conductive patterns CP may be interposed between the second terminal of the selection transistor SE and the memory element ME, but the inventive concept is not limited thereto. For example, in an exemplary embodiment, two or four or more conductive patterns CP may be provided between the second terminal of the selection transistor SE and the memory element ME.

In an exemplary embodiment, the memory element ME may further include a bottom electrode BE and a top electrode TE. The magnetic tunnel junction MTJ may be disposed between the bottom electrode BE and the top electrode TE. For example, the bottom electrode BE may be disposed between the bottom electrode contact BEC and the magnetic tunnel junction MTJ, and the top electrode TE may be disposed between the magnetic tunnel junction MTJ and the second conductive line CL2. Each of the bottom and top electrodes BE and TE may include at least one of conductive metal nitrides (e.g., titanium nitride or tantalum nitride), at least one of transition metals (e.g., titanium or tantalum), or at least one of rare-earth metals (e.g., ruthenium or platinum). The memory element ME, the selection transistor SE, the conductive lines CL1 and CL2, the conductive patterns CP, and the via plugs VPLG may constitute the memory structure MS of FIG. 1.

According to an exemplary embodiment of the present inventive concept, the plurality of conductive patterns CP and the first conductive line CL1 may be formed under the same design rule, and the second conductive line CL2 may be formed under a design rule larger than the design rule for the plurality of conductive patterns CP and the first conductive line CL1. In an exemplary embodiment, the design rule may refer to a width design rule under which a pattern or line has a predetermined minimum width or a predetermined thickness. Accordingly, the second conductive line CL2 may have a feature size (e.g., a width or a thickness) that is larger than feature sizes of the first conductive line CL1 and the conductive patterns CP. This will be described in more detail below. In an exemplary embodiment, the free layer FL and the pinned layer PL may be connected to the second conductive line CL2 and the selection transistor SE, respectively, but the present inventive concept is not limited thereto. For example, unlike FIG. 2, the pinned layer PL may be connected to the second conductive line CL2, and the free layer FL may be connected to the selection transistor SE. Hereinafter, the magnetic tunnel junction MTJ will be described in more detail with reference to FIGS. 3 and 4.

Figure 3:
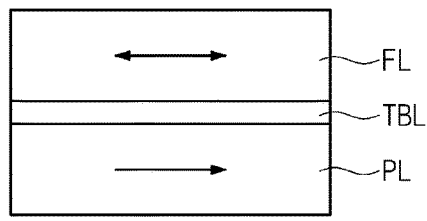
FIGS. 3 and 4 are conceptual diagrams illustrating a magnetic tunnel junction according to an exemplary embodiment of the present inventive concept.
Figure 4:
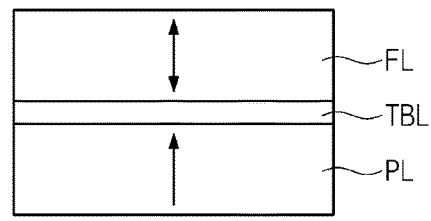

FIGS. 3 and 4 are conceptual diagrams illustrating a magnetic tunnel junction according to an exemplary embodiment of the present inventive concept.

Electric resistance of the magnetic tunnel junction MTJ may be dependent on relative magnetization directions of the pinned and free layers PL and FL. For example, the electric resistance of the magnetic tunnel junction MTJ may be much greater when magnetization directions of the pinned and free layers PL and FL are antiparallel to each other than when they are parallel to each other. As a result, the electric resistance of the magnetic tunnel junction MTJ may be controlled by changing a magnetization direction of the free layer FL to store data in the magnetic memory device according to an exemplary embodiment of the present inventive concept.

Referring to FIG. 3, the pinned and free layers PL and FL may be configured to have an in-plane magnetization structure. For example, at least one or each of the pinned and free layers PL and FL may be or include at least one magnetic layer, whose magnetization direction is substantially parallel to a top surface of the tunnel barrier layer TBL. In this case, the pinned layer PL may include a layer containing an anti-ferromagnetic material and another layer containing a ferromagnetic material. In an exemplary embodiment, the layer containing an anti-ferromagnetic material may include PtMn, IrMn, MnO, MnS, MnTe, $MnF_2$, $FeCl_2$, FeO, $CoCl_2$, CoO, $NiCl_2$, NiO, or Cr. In an exemplary embodiment, the layer containing an anti-ferromagnetic material may include at least one of precious metals. The precious metals may include ruthenium (Ru), rhodium (Rh), palladium (Pd), osmium (Os), iridium (Ir), platinum (Pt), gold (Au), or silver (Ag). By contrast, the layer containing a ferromagnetic material may include CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The free layer FL may be configured to have a variable or switchable magnetization direction. The free layer FL may include a ferromagnetic material. As an example, the free layer FL may include FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The free layer FL may include a plurality of layers. For example, the free layer FL may include a plurality of ferromagnetic layers and a non-magnetic layer interposed between the ferromagnetic layers. In this case, the ferromagnetic layers and the non-magnetic layer may constitute a synthetic antiferromagnetic structure. The presence of the synthetic antiferromagnetic structure may allow the magnetic memory device to have a reduced critical current density and increased thermal stability.

The tunnel barrier layer TBL may include magnesium oxide, titanium oxide, aluminum oxide, magnesium-zinc oxide, magnesium-boron oxide, titanium nitride, or vanadium nitride. For example, the tunnel barrier layer TBL may be a single layer of magnesium oxide (MgO). The present inventive concept is not limited thereto. For example, the tunnel barrier layer TBL may include a plurality of layers. The tunnel barrier layer TBL may be formed using a chemical vapor deposition (CVD) process.

Referring to FIG. 4, the pinned and free layers PL and FL may be configured to have a perpendicular magnetization structure. For example, at least one or each of the pinned and free layers PL and FL may be or include at least one magnetic layer, whose magnetization direction is substantially normal to the top surface of the tunnel barrier layer TBL. In an exemplary embodiment, at least one or each of the pinned and free layers PL and FL may include at least one of materials with an $L1_0$ crystal structure, materials having the hexagonal closed packed (HCP) structure, or amorphous rare-earth transition metal (RE-TM) alloys. For example, each of the pinned and free layers PL and FL may include at least one of $L1_0$ materials, such as $Fe_{50}Pt_{50}$, $Fe_{50}Pd_{50}$, $Co_{50}Pt_{50}$, $Co_{50}Pd_{50}$ and $Fe_{50}Ni_{50}$. In an exemplary embodiment, each of the pinned and free layers PL and FL may include at least one of disordered HCP cobalt-platinum (CoPt) alloys containing 10-45 atomic percent (at. %) platinum or ordered HCP $Co_3Pt$ alloys. In an exemplary embodiment, each of the pinned and free layers PL and FL may include at least one of rare-earth-transition-metal (RE-TM) amorphous alloys containing iron (Fe), cobalt (Co), nickel (Ni) or at least one of rare-earth metals such as terbium (Tb), dysprosium (Dy), and gadolinium (Gd).

At least one of the pinned and free layers PL and FL may include a material with an interface perpendicular magnetic anisotropy. The interface perpendicular magnetic anisotropy may refer to a perpendicular magnetization phenomenon, which may be seen at an interface of a magnetic layer with an intrinsically in-plane magnetization property, when the magnetic layer is provided adjacent to or in contact with another layer. Here, the term "intrinsic in-plane magnetization property" will be used to mean that a magnetization direction of a magnetic layer is oriented parallel to a longitudinal direction thereof, when there is no external magnetic field applied thereto. For example, in the case that a magnetic layer with the intrinsic in-plane magnetization property is formed on a substrate and there is no external magnetic field applied thereto, a magnetization direction of the magnetic layer may be oriented substantially parallel to the top surface of the substrate.

For example, each of the pinned and free layers PL and FL may include cobalt (Co), iron (Fe), or nickel (Ni). In addition, each of the pinned and free layers PL and FL may further include at least one of non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), or nitrogen (N). For example, each of the pinned and free layers PL and FL may include a layer of CoFe or NiFe, in which boron (B) is added. Furthermore, at least one of the pinned and free layers PL and FL may further include titanium (Ti), aluminum (Al), magnesium (Mg), tantalum (Ta), or silicon (Si) to lower saturation magnetization thereof.

Figure 5:
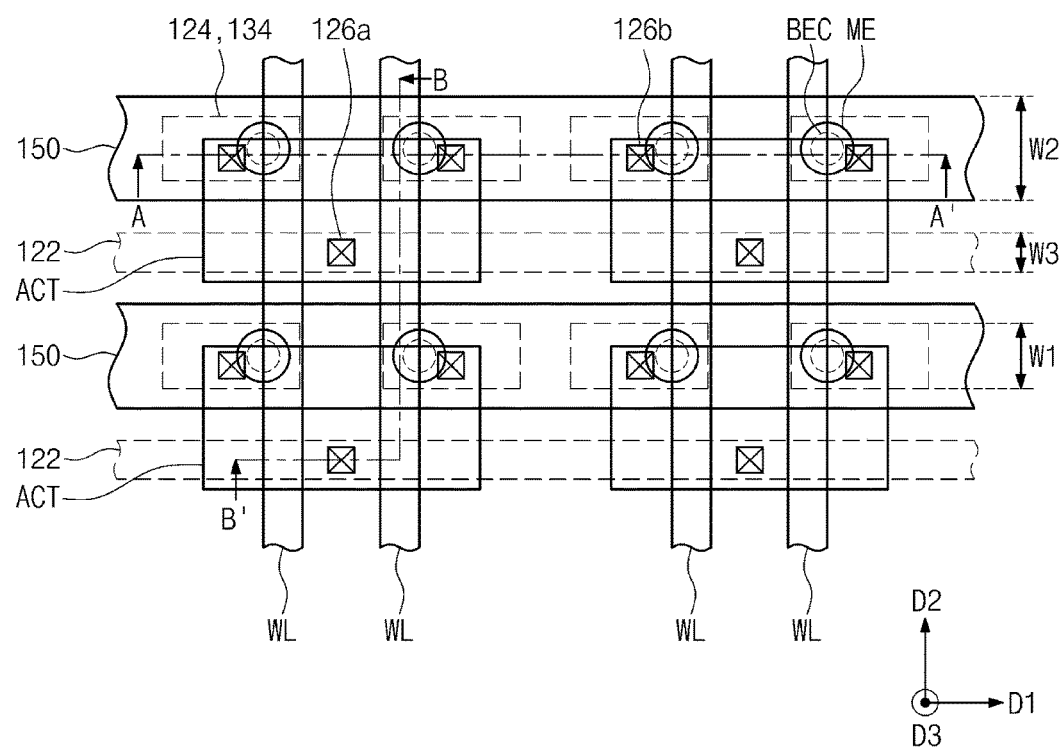
FIG. 5 is layout illustrating the memory structure of FIG. 1 according to an exemplary embodiment of the present inventive concept.
Figure 6:
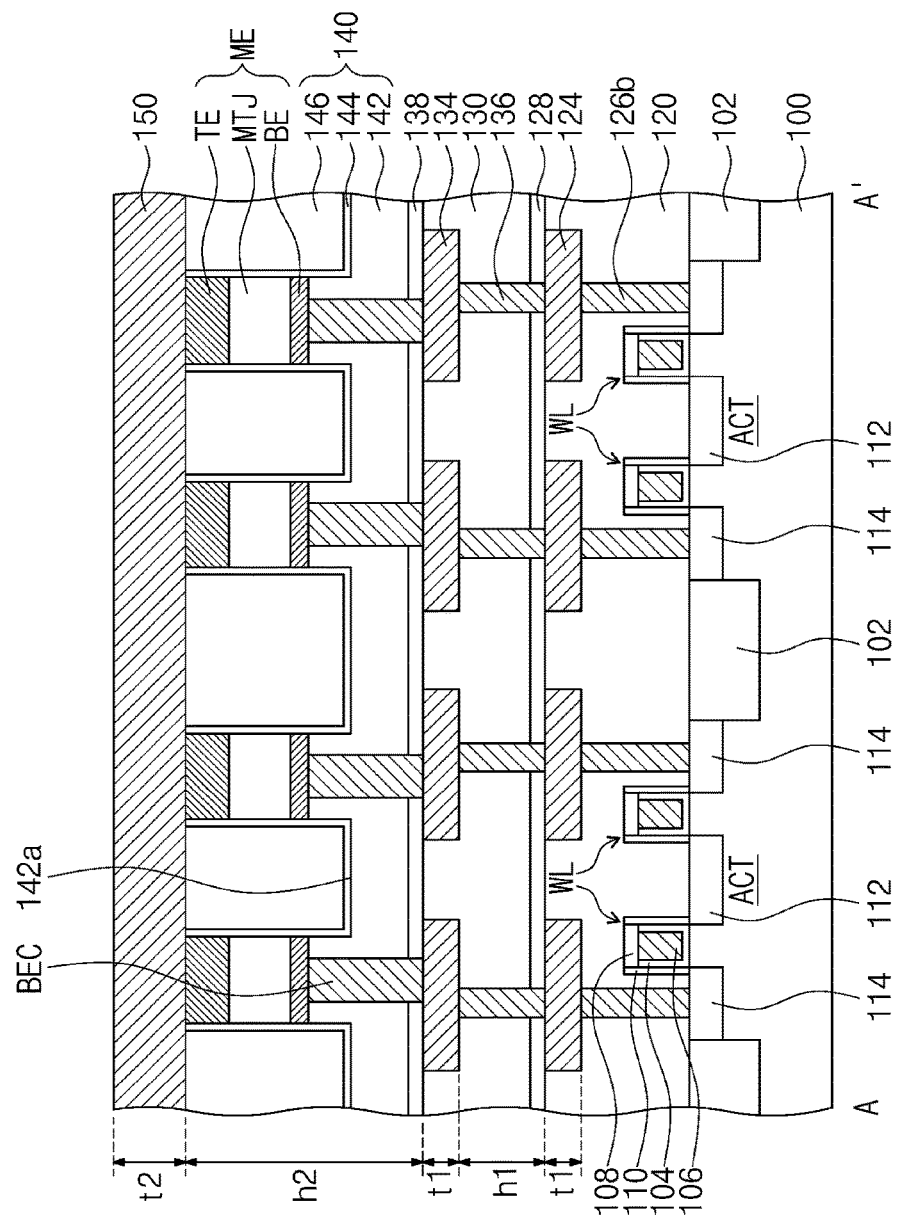
FIGS. 6 and 7 are sectional views taken along lines A-A' and B-B' of FIG. 5, respectively, according to an exemplary embodiment of the present inventive concept.
Figure 7:
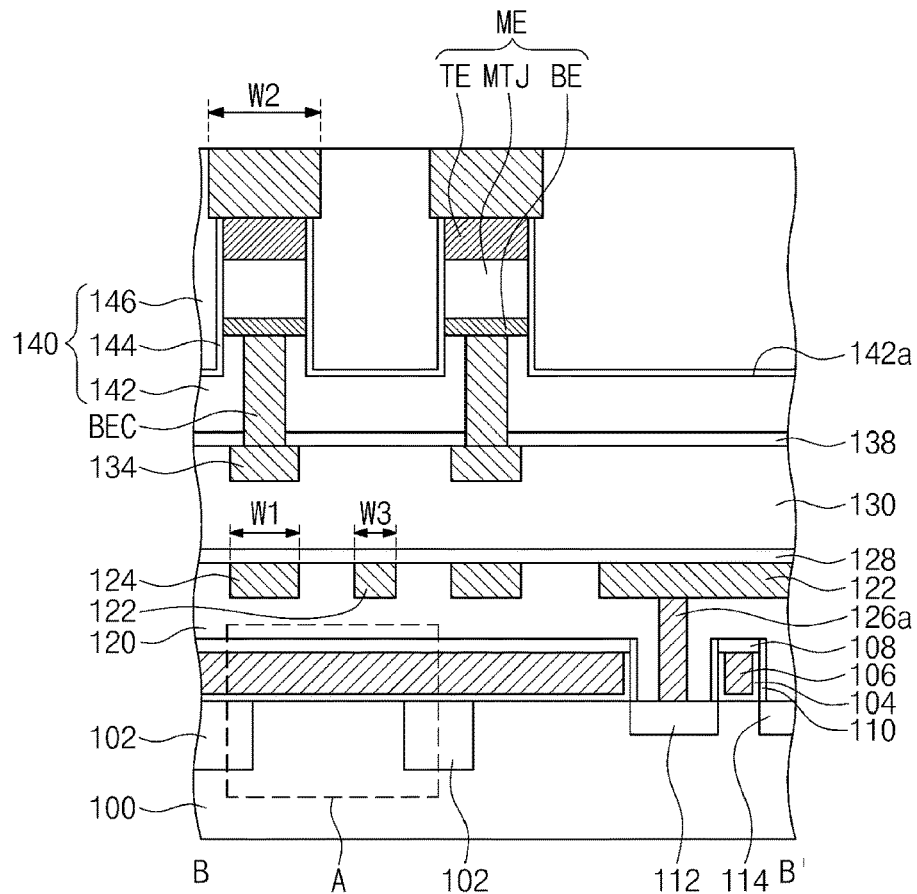
Figure 8:
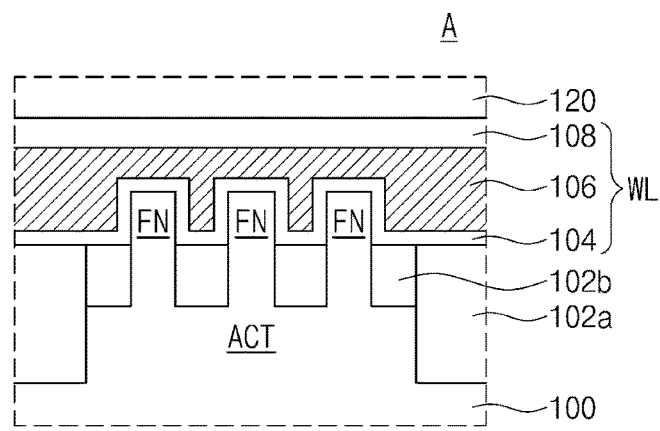
FIG. 8 is an enlarged view corresponding to a portion 'A' of FIG. 7, according to an exemplary embodiment of the present inventive concept.

FIG. 5 is a layout illustrating the memory structure of FIG. 1 according to an exemplary embodiment of the present inventive concept. FIGS. 6 and 7 are sectional views taken along lines A-A' and B-B' of FIG. 5, respectively, according to an exemplary embodiment of the present inventive concept. FIG. 8 is an enlarged view corresponding to a portion 'A' of FIG. 7, according to an exemplary embodiment of the present inventive concept.

Referring to FIGS. 5, 6, and 7, a device isolation layer 102 may be provided in a substrate 100 to define active portions ACT. The substrate 100 may be, for example, a silicon substrate, a germanium substrate, or a silicon-germanium substrate.

When viewed in a plan view, the active portions ACT may be a rectangular shape whose longitudinal axis is parallel to a first direction D1 and may be arranged to be spaced apart from each other in the first direction D1 and a second direction D2 perpendicular to the first direction D1. For example, the active portions ACT may be two-dimensionally arranged to form a plurality of rows and a plurality of columns. The active portions ACT may be doped with impurities of a first conductivity type.

The word lines WL may be provided on the substrate 100 to extend in the second direction D2 and to cross the active portions ACT. For example, each pair of the word lines WL may be provided to commonly cross the active portions ACT arranged in the second direction D2. Each of the word lines WL may correspond to a gate electrode 106 provided on the substrate 100. A gate dielectric layer 104 may be interposed between the gate electrode 106 and the active portions ACT. A gate mask pattern 108 may be provided on the gate electrode 106. The gate electrode 106 may include doped semiconductor materials (e.g., doped silicon), metals (e.g., tungsten, aluminum, titanium, and/or tantalum), conductive metal nitrides (e.g., titanium nitride, tantalum nitride, and/or tungsten nitride), or metal-semiconductor compounds (e.g., metal silicide). The gate dielectric layer 104 may include an oxide (e.g., silicon oxide), a nitride (e.g., silicon nitride), an oxynitride (e.g., silicon oxynitride), or a high-k dielectric (e.g., an insulating metal oxide such as hafnium oxide and aluminum oxide). The gate mask pattern 108 may be formed of or include oxide (e.g., silicon oxide), nitride (e.g., silicon nitride), or oxynitride (e.g., silicon oxynitride). Gate spacers 110 may be provided on side surfaces of the gate electrode 106. The gate spacers 110 may be formed of or include, for example, silicon nitride or silicon oxynitride. The gate dielectric layer 104 may extend into a space between the gate electrode 106 and the gate spacers 110. A portion of the word line WL overlapped with the active portion ACT may serve as a gate electrode of the selection transistor SE of FIG. 2.

A first impurity region 112 may be provided in the active portion ACT between one of a pair of word lines WL and the other of the pair of the word lines WL, and a pair of second impurity regions 114 may be provided in opposite edge regions of the active portion ACT, which are positioned outside the pair of the word lines WL. The first and second impurity regions 112 and 114 may serve as source/drain regions of the selection transistor. Thus, a pair of the selection transistors sharing the first impurity region 112 may be provided on the active portion ACT. The first and second impurity regions 112 and 114 may be doped with impurities of a second conductivity type that is different from the first conductivity type of the active portions ACT. One of the first and second conductivity types may be an n-type, and the other may be a p-type. For example, the selection transistor may be a planar transistor.

In an exemplary embodiment, as shown in FIG. 8, the active portion ACT may include fin portions FN protruding from the substrate 100 in a third direction D3, which is perpendicular to both the first and second directions D1 and D2. For example, the selection transistor may be provided to have a Fin-FET structure. In an exemplary embodiment, the device isolation layer 102 may include a first device isolation layer 102a, which is provided between adjacent ones of the active portions ACT, and a second device isolation layer 102b, which is provided at both sides of the fin portions FN. The second device isolation layer 102b may be provided to expose upper portions of the fin portions FN. The word line WL may be provided to cover side and top surfaces of the fin portions FN exposed by the second device isolation layer 102b. The fin portions FN may extend in the first direction D1 and may be spaced apart from each other in the second direction D2.

Next, referring to FIGS. 5 to 7, a first interlayered insulating layer 120 may be provided on the substrate 100 to cover the word lines WL. The first interlayered insulating layer 120 may be formed of or include, for example, silicon oxide, silicon nitride, or silicon oxynitride.

Lower conductive lines 122 and second lower conductive patterns 124 may be provided in the first interlayered insulating layer 120. The lower conductive lines 122 may have the line-shaped structure extending in the first direction D1 and may be arranged in the second direction D2. The second lower conductive patterns 124 may be arranged in the first and second directions D1 and D2 to form a plurality of columns and a plurality of rows, and each of the second lower conductive patterns 124 may be provided in the form of an island. The rows of the second lower conductive patterns 124 parallel to the first direction D1 and the lower conductive lines 122 may be alternately arranged in the second direction D2. The second lower conductive patterns 124 and the lower conductive lines 122 may have top surfaces, which are located at substantially the same level or at substantially the same height as a top surface of the first interlayered insulating layer 120. For example, the first interlayered insulating layer 120, the second lower conductive patterns 124, and the lower conductive lines 122 may have top surfaces that are coplanar with each other at substantially the same height from a top surface of the substrate 100.

The lower conductive lines 122 may be coupled to the first impurity regions 112 through first contact plugs 126a penetrating the first interlayered insulating layer 120, and the second lower conductive patterns 124 may be coupled to the second impurity regions 114, respectively, through second contact plugs 126b penetrating the first interlayered insulating layer 120. In an exemplary embodiment, one or each of the lower conductive lines 122 may be connected in common to the first impurity regions 112 of the active portions ACT arranged in the first direction D1. On each of the active portions ACT, a pair of the second contact plugs 126b coupled to the second impurity regions 114 may be spaced apart from each other in the first direction D1 with a pair of the word lines WL interposed therebetween, and the first contact plug 126a coupled to the first impurity region 112 may be provided between the pair of the word lines WL to be spaced apart from the second contact plugs 126b in a diagonal direction.

The lower conductive lines 122, the second lower conductive patterns 124, and the contact plugs 126a and 126b may include a metallic material. For example, the lower conductive lines 122 and the second lower conductive patterns 124 may include the same metallic material (e.g., copper (Cu)), and the contact plugs 126a and 126b may include tungsten (W). Furthermore, the lower conductive lines 122, the second lower conductive patterns 124, and the contact plugs 126a and 126b may further include a conductive metal nitride material (e.g., titanium nitride, tantalum nitride, or tungsten nitride).

A first etch stop layer 128 and a second interlayered insulating layer 130 may be sequentially provided on the first interlayered insulating layer 120. The second interlayered insulating layer 130 may be referred to as a lower interlayered insulating layer. The first etch stop layer 128 may include silicon nitride or silicon carbonitride. The second interlayered insulating layer 130 may include silicon oxide, silicon nitride, or silicon oxynitride.

First lower conductive patterns 134 may be provided in the second interlayered insulating layer 130. The first lower conductive patterns 134 may have top surfaces that are located at substantially the same height as a top surface of the second interlayered insulating layer 130. The first lower conductive patterns 134 may be coupled to the second lower conductive patterns 124, respectively, through via plugs 136 penetrating the second interlayered insulating layer 130 and the first etch stop layer 128. The first lower conductive patterns 134 and the via plugs 136 may include the same material as the second lower conductive patterns 124. For example, the first lower conductive patterns 134 and the via plugs 136 may include copper. The first and second interlayered insulating layers 120 and 130 and the first etch stop layer 128 interposed therebetween may be used as a lower insulating layer. In an exemplary embodiment, a plurality of lower conductive patterns 134 and 124, the upper conductive line 150, the first lower interconnection line 135, and the upper interconnection line 152 may include the same metal material.

A second etch stop layer 138 and a third interlayered insulating layer 140 may be sequentially provided on the second interlayered insulating layer 130. The third interlayered insulating layer 140 may be referred to as an upper interlayered insulating layer. The second etch stop layer 138 may include the same material as the first etch stop layer 128. For example, the second etch stop layer 138 may include silicon nitride or silicon carbonitride.

A plurality of memory elements ME may be provided in the third interlayered insulating layer 140. The plurality of the memory elements ME may be two-dimensionally provided in the form of island. When viewed in a plan view, each of the memory elements ME may be overlapped with the lower conductive patterns 124 and 134 thereunder. In an exemplary embodiment, each of the memory elements ME may include the bottom electrode BE, the magnetic tunnel junction MTJ, and the top electrode TE. The bottom electrode BE, the magnetic tunnel junction MTJ, and the top electrode TE may be configured to have the same features as those described with reference to FIGS. 2 to 4, and thus, a detail description thereof will be omitted. Each of the memory elements ME may be connected to the first lower conductive pattern 134 through the bottom electrode contact BEC thereunder. The bottom electrode contact BEC may include at least one of metals (e.g., tungsten, aluminum, titanium, or tantalum), at lease one of conductive metal nitrides (e.g., titanium nitride, tantalum nitride, or tungsten nitride), or at least one of metal-semiconductor compounds (e.g., metal silicide).

The upper conductive lines 150 may be provided on the memory elements ME. The upper conductive lines 150 may be provided on the third interlayered insulating layer 140. The upper conductive lines 150 may have the line-shaped structure extending in the first direction D1 and may be arranged in the second direction D2. In an exemplary embodiment, one or each of the upper conductive lines 150 may be connected in common to the plurality of the memory elements ME arranged in the first direction D1. Each of the upper conductive lines 150 may be directly coupled to the memory element ME thereunder. For example, wherein the upper conductive line 150 may be in direct contact with the top electrode TE of the memory element ME.

The third interlayered insulating layer 140 may include a first mold insulating layer 142, a protection insulating layer 144, and a second mold insulating layer 146. The bottom electrode contact BEC may be provided to penetrate the first mold insulating layer 142 and the second etch stop layer 138 and to connect the memory element ME to the first lower conductive pattern 134. A top surface of the first mold insulating layer 142, not overlapped with the memory elements ME, may have a recessed top surface 142a that is recessed toward the substrate 100. Unlike that illustrated in the drawings, the recessed top surface 142a may have a concave shape in a direction toward the substrate 100. For example, the recessed top surface 142a may be lower than a bottom surface of the bottom electrode BE. The second mold insulating layer 146 may be provided on the recessed top surface 142a of the first mold insulating layer 142 to cover side surfaces of the memory elements ME. The upper conductive lines 150 may have bottom surfaces that are located at substantially the same height as a top surface of the second mold insulating layer 146. For example, the top surface of the second mold insulating layer 146 and the bottom surface of the upper conductive lines 150 may be coplanar with each other at substantially the same height from the substrate 100. The protection insulating layer 144 may be interposed between the side surfaces of the memory elements ME and the second mold insulating layer 146 and between the first mold insulating layer 142 and the second mold insulating layer 146. The first and second mold insulating layers 142 and 146 may include, for example, silicon oxide, and the protection insulating layer 144 may include, for example, silicon nitride. The upper conductive lines 150 may include the same material as the lower conductive patterns 124 and 134 or the lower conductive lines 122. For example, the upper conductive lines 150 may include copper. Furthermore, the upper conductive lines 150 may further include a conductive metal nitride material (e.g., titanium nitride and/or tantalum nitride).

The lower conductive line 122 and the upper conductive line 150 may be respectively used as the first conductive line CL1 and the second conductive line CL2 of FIG. 2, and the lower conductive patterns 124 and 134 may be used as the conductive patterns CP of FIG. 2. In addition, the via plugs 136 may be used as the via plugs VPLG of FIG. 2. For example, the lower conductive line 122 may serve as a source line, and the upper conductive line 150 may serve as a bit line.

According to an exemplary embodiment of the inventive concept, the lower conductive line 122 and the lower conductive patterns 124 and 134 may be formed under the same design rule (hereinafter, referred to as 'a first design rule'), and the upper conductive line 150 may be formed under an increased design rule (hereinafter, referred to as 'a second design rule') larger than the first design rule. Thus, the upper conductive line 150 may be greater than the lower conductive line 122 and the lower conductive patterns 124 and 134 in terms of feature size (e.g., a width or a thickness). For example, the lower conductive patterns 124 and 134 may have substantially the same thickness (e.g., a first thickness t1), and the upper conductive line 150 may have a second thickness t2 larger than the first thickness t1. In an exemplary embodiment, the second thickness t2 may be two or more times the first thickness t1. For example, the lower conductive patterns 124 and 134 may have first widths W1, and the upper conductive line 150 (the second conductive line CL2) may have a second width W2 larger than the first widths W1. The first widths W1 of the lower conductive patterns 124 and 134 may be the same as or different from each other. For example, the second width W2 may be about two times the first widths W1. Here, the minimum of the second width W2 that is allowed under the second design rule may be equal to or larger than two times the minimum of the first widths W1 that is allowed under the first design rule. The lower conductive patterns 124 and 134, which are vertically adjacent to each other, may be spaced apart from each other by a first distance h1, and the first lower conductive pattern 134 and the upper conductive line 150, which are vertically adjacent to each other, may be spaced apart from each other by a second distance h2. For example, the first distance h1 may be a distance between a bottom surface of the first lower conductive pattern 134 and a top surface of the second lower conductive pattern 124. For example, the second distance h2 may be a distance between a bottom surface of the upper conductive line 150 and a top surface of the first lower conductive pattern 134. Due to the different design rules, the second distance h2 may be larger than the first distance h1. For example, the second distance h2 may be equal to or larger than about two times the first distance h1. The first distance h1 may correspond to a vertical length of the via plug 136 (hereinafter, referred to as 'a first height h1'). The lower conductive line 122 may have substantially the same thickness as the lower conductive patterns 124 and 134 (e.g., the first thickness t1). In addition, the lower conductive line 122 may have a third width W3, which is substantially equal to or less than the first width W1 of the second lower conductive pattern 124. Here, each of the widths W1, W2, and W3 may be measured in a direction parallel to the second direction D2. Although, in the present example, the lower conductive line 122 is illustrated to be located at the same height as second lower conductive pattern 124, the inventive concept is not limited to this example. In an exemplary embodiment, the lower conductive line 122 may be provided in the second interlayered insulating layer 130 and may be located at the same height as the first lower conductive pattern 134. Although two interlayered insulating layers with the lower conductive patterns are illustrated as being interposed between the memory elements ME and the substrate 100, the inventive concept is not limited to this example. For example, five or six interlayered insulating layers with the lower conductive patterns may be interposed between the memory elements ME and the substrate 100. In this case, five or six lower conductive patterns, which are stacked to be vertically spaced apart from each other, may be provided between the memory element ME and the second impurity region 114. An uppermost one of the lower conductive patterns disposed at the highest position from the substrate 100 may be referred to as the uppermost lower conductive pattern. A lowermost one of the lower conductive patterns disposed at the lowest position from the substrate 100 may be referred to as the lowermost lower conductive pattern. For example, the first lower conductive pattern 134 may correspond to the uppermost lower conductive pattern 134 in an exemplary embodiment of FIG. 15; and the second lower conductive pattern 124 may correspond to the lowermost conductive pattern 124 in an exemplary embodiment of FIG. 15.

According to an exemplary embodiment of the inventive concept, the upper conductive line 150 on the memory element ME may be formed to have an increased design rule, compared with the lower conductive patterns 124 and 134 below the memory element ME, and thus it may be possible to form the memory element ME, while minimizing a change in a logic process (e.g., a process for forming interconnection lines in a logic structure). In addition, it may be possible to prevent process failure from occurring during the formation of the memory element ME, without any additional process. Accordingly, it may be possible to fabricate a highly reliable semiconductor device using a simple process. This will be described in more detail below.

Figure 9:
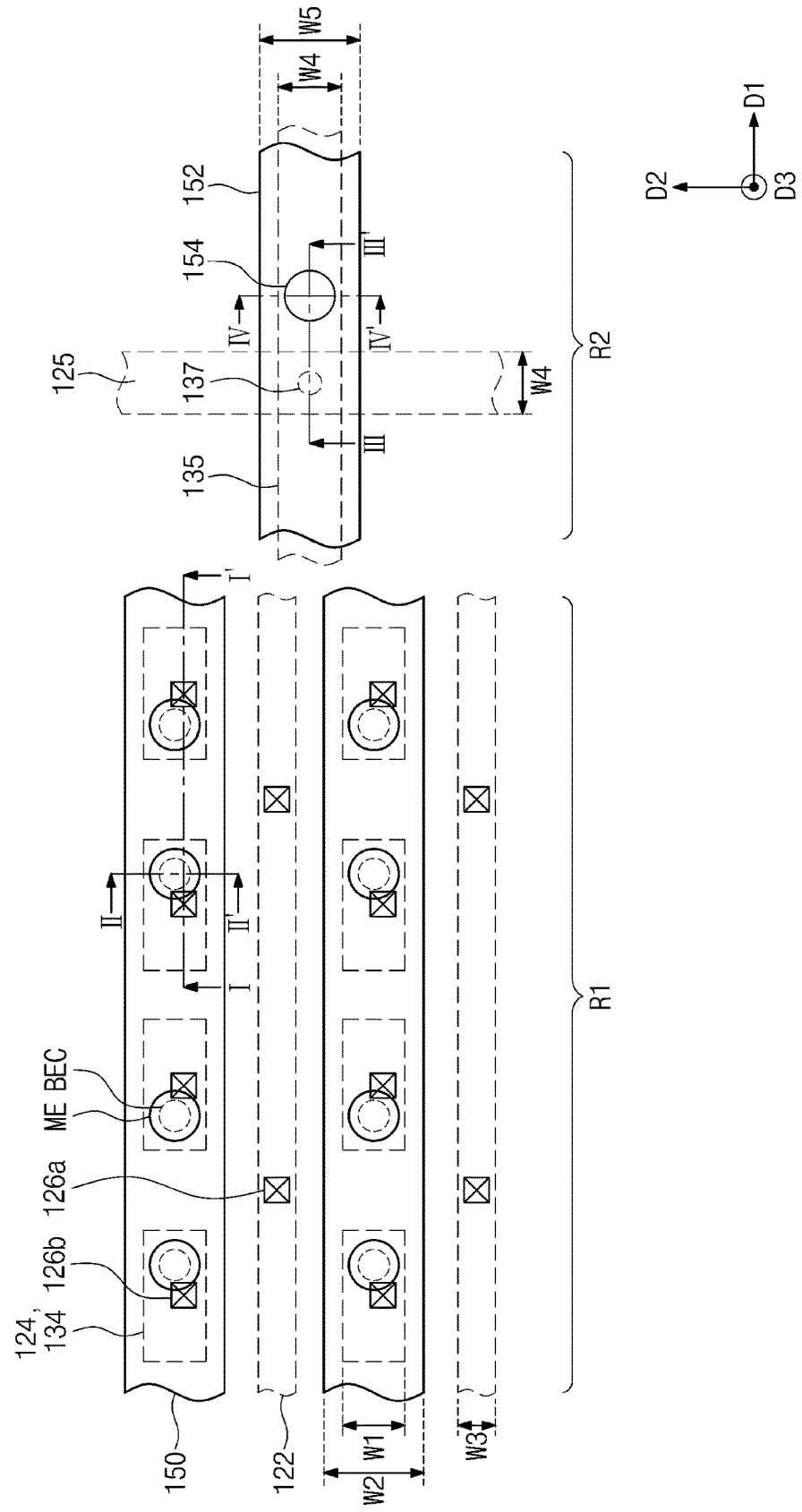
FIG. 9 is a layout illustrating a semiconductor device according to an exemplary embodiment of the present inventive concept.

FIG. 9 is a layout illustrating a semiconductor device according to an exemplary embodiment of the present inventive concept. FIGS. 10 to 15 are sectional views taken along lines I-I', II-II', III-III', and IV-IV' of FIG. 9, according to an exemplary embodiment of the present inventive concept. FIG. 16 is a flowchart of fabricating the semiconductor device of FIG. 9 according to an exemplary embodiment of the present inventive concept. Hereinafter, a fabrication process of the semiconductor device of FIG. 9 will be described with reference to FIGS. 9 to 16. In the following description, a previously described element may be identified by a similar or identical reference number without repeating an overlapping description thereof, for the sake of brevity.

Figure 10:
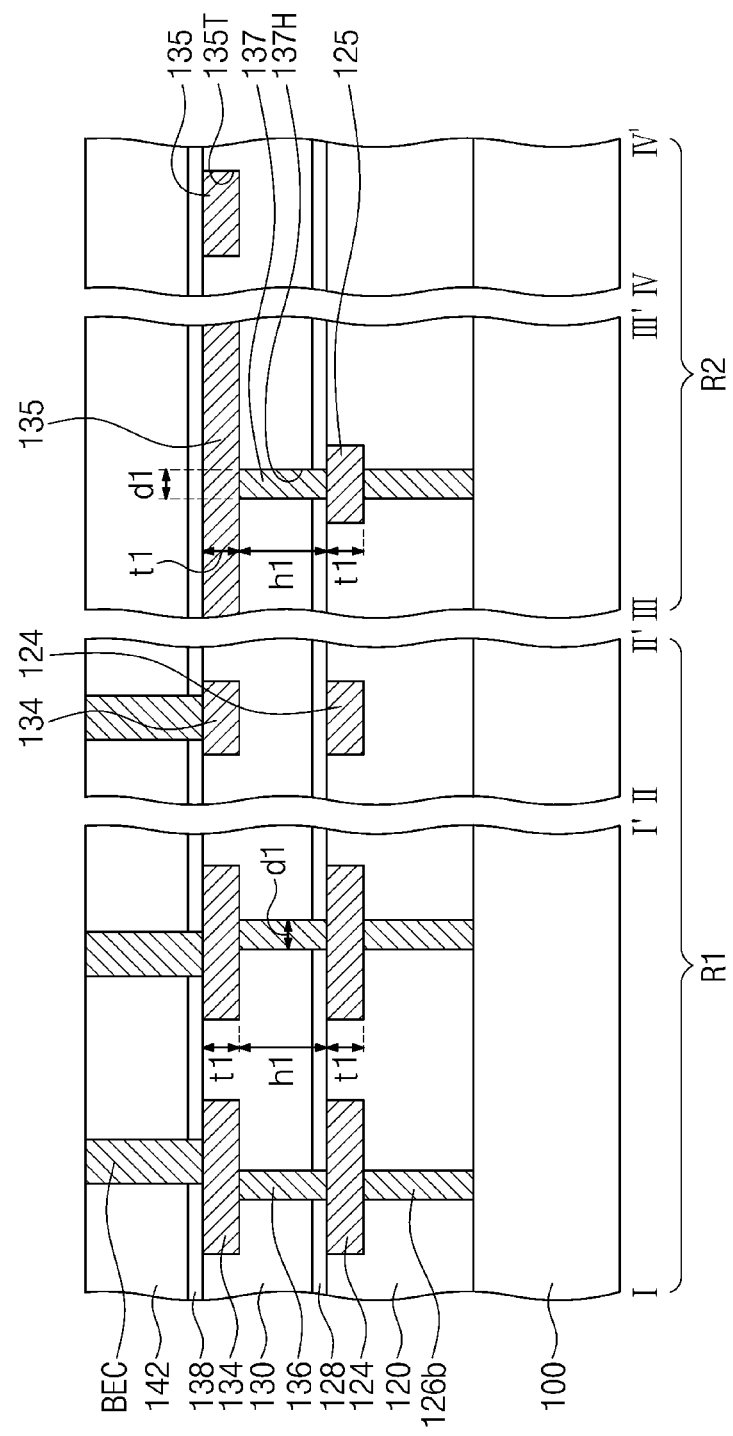
FIGS. 10 to 15 are sectional views, each of which illustrates vertical sections taken along lines I-I', II-II', III-III', and IV-IV' of FIG. 9, according to an exemplary embodiment of the present inventive concept.

Referring to FIGS. 9, 10 and 16, a first lower interconnection structure and a second lower interconnection structure is formed, using a first design rule, on a first region R1 and a second region R2 of a substrate 100, respectively, according to an exemplary embodiment of the present inventive concept. (Step S110). The substrate 100 may be provided. The substrate 100 may include the first region R1 and the second region R2. The first region R1 may be a portion of a region, on which the memory structure MS of FIG. 1 is formed, and the second region R2 is a portion of a region, on which the logic structure LS of FIG. 1 is formed. For example, selection elements (e.g., selection transistors) constituting the memory cells may be formed on the substrate 100 of the first region R1, and a plurality of logic transistors constituting the logic circuit or the peripheral circuit may be formed on the substrate 100 of the second region R2.

The lower insulating layer may be formed on the substrate 100 of the first and second regions R1 and R2. The lower insulating layer may include the first interlayered insulating layer 120, the first etch stop layer 128, and the second interlayered insulating layer 130, which are sequentially stacked on the substrate 100. The first lower interconnection structure may be formed in the lower insulating layer of the first region R1. The first lower interconnection structure may include, for example, the lower conductive lines 122, the lower conductive patterns 124 and 134, and the plugs 126*a*, 126*b*, and 136. The lower conductive lines 122, the lower conductive patterns 124 and 134, and the plugs 126*a*, 126*b*, and 136 may be configured to have the same features as those described with reference to FIGS. 5 to 7, and thus, a detail description thereof will be omitted. Hereinafter, the contact plugs 126*a* and 126*b* may be referred to as the cell contact plugs 126*a* and 126*b*, and the via plugs 136 may be referred to as the cell via plugs 136.

The second lower interconnection structure may be formed in the lower insulating layer of the second region R2. The second lower interconnection structure may include lower interconnection lines 125 and 135, and plugs 127 and 137. The lower interconnection lines 125 and 135 may include a first lower interconnection line 135, which is formed in the second interlayered insulating layer 130 of the second region R2, and a second lower interconnection line 125, which is formed in the first interlayered insulating layer 120 of the second region R2. The second lower interconnection line 125 may have a top surface, which is located at substantially the same height as a top surface of the second lower conductive patterns 124. For example, the second lower interconnection line 125, the second lower conductive patterns 124, and the first interlayered insulating layer 120 may have top surfaces that are coplanar with each other at substantially the same height from the substrate 100. Similarly, the first lower interconnection line 135 may have a top surface that is located at substantially the same height as top surfaces of the first lower conductive patterns 134. The lower interconnection lines 125 and 135 may be formed of the same material as the lower conductive lines 122 and the lower conductive patterns 124 and 134. For example, the lower interconnection lines 125 and 135 may include copper.

The plugs 127 and 137 may include a peripheral contact plug 127, which is provided to penetrate the first interlayered insulating layer 120 of the second region R2 and to connect the second lower interconnection line 125 to the substrate 100 of the second region R2, and a first peripheral via plug 154, which is provided to penetrate the second interlayered insulating layer 130 of the second region R2 and the first etch stop layer 128 of the second region R2 and to connect the second lower interconnection line 125 to the first lower interconnection line 135. The peripheral contact plug 127 may be formed of the same material as the cell contact plugs 126*a* and 126*b*, and the second peripheral via plug 137 may be formed of the same material as the cell via plugs 136. The lower interconnection lines 125 and 135 and the lower conductive patterns 124 and 134 may be formed under the same design rule (e.g., the first design rule). Thus, the lower interconnection lines 125 and 135 and the lower conductive patterns 124 and 134 may have the same thickness (e.g., the first thickness t1). The lower interconnection lines 125 and 135 may have fourth widths W4, which are equal to or different from the first width W1 of the lower conductive patterns 124 and 134. Furthermore, the cell via plugs 136 and the second peripheral via plug 137 may have the same height (e.g., the first height h1).

In an exemplary embodiment, the lower conductive lines 122, the lower conductive patterns 124 and 134, the lower interconnection lines 125 and 135, and the via plugs 136 and 137 may be formed by a single or dual damascene process.

For example, the first lower interconnection line 135 and the second peripheral via plug 137 may be formed by forming a trench 135T and a first peripheral via hole 137H in the second interlayered insulating layer 130 of the second region R2 and filling the trench 135T and the first peripheral via hole 137H with a conductive material. Here, the first peripheral via hole 137H may be formed to extend from the trench 135T and to expose the second lower interconnection line 125. The second peripheral via plug 137 may have a first diameter d1 which corresponds to a diameter or width of the first peripheral via hole 137H. For example, the cell via plugs 136 may have substantially the same diameter (e.g., the first diameter d1) as the second peripheral via plug 137. Unlike that illustrated in the drawings, a diameter or width of each of the via plugs 136 and 137 may decrease in a downward direction. In this case, the first diameter d1 may correspond to the largest diameter or width of each of the via plugs 136 and 137.

The second etch stop layer 138 and the first mold insulating layer 142 may be sequentially formed on the second interlayered insulating layer 130 of the first and second regions R1 and R2. Thereafter, the bottom electrode contacts BEC may be formed on the first region R1 to penetrate the first mold insulating layer 142 and the second etch stop layer 138 and to be connected to the first lower conductive patterns 134. For example, the formation of the bottom electrode contacts BEC may include forming bottom electrode contact holes to penetrate the first mold insulating layer 142 and the second etch stop layer 138 and to expose the first lower conductive patterns 134, and then, filling the bottom electrode contact holes with a conductive material.

Referring to FIGS. 9, 11, 12 and 16, memory elements ME are formed on the first lower interconnection structure according to an exemplary embodiment of the present inventive concept. (Step S120).

Figure 11:
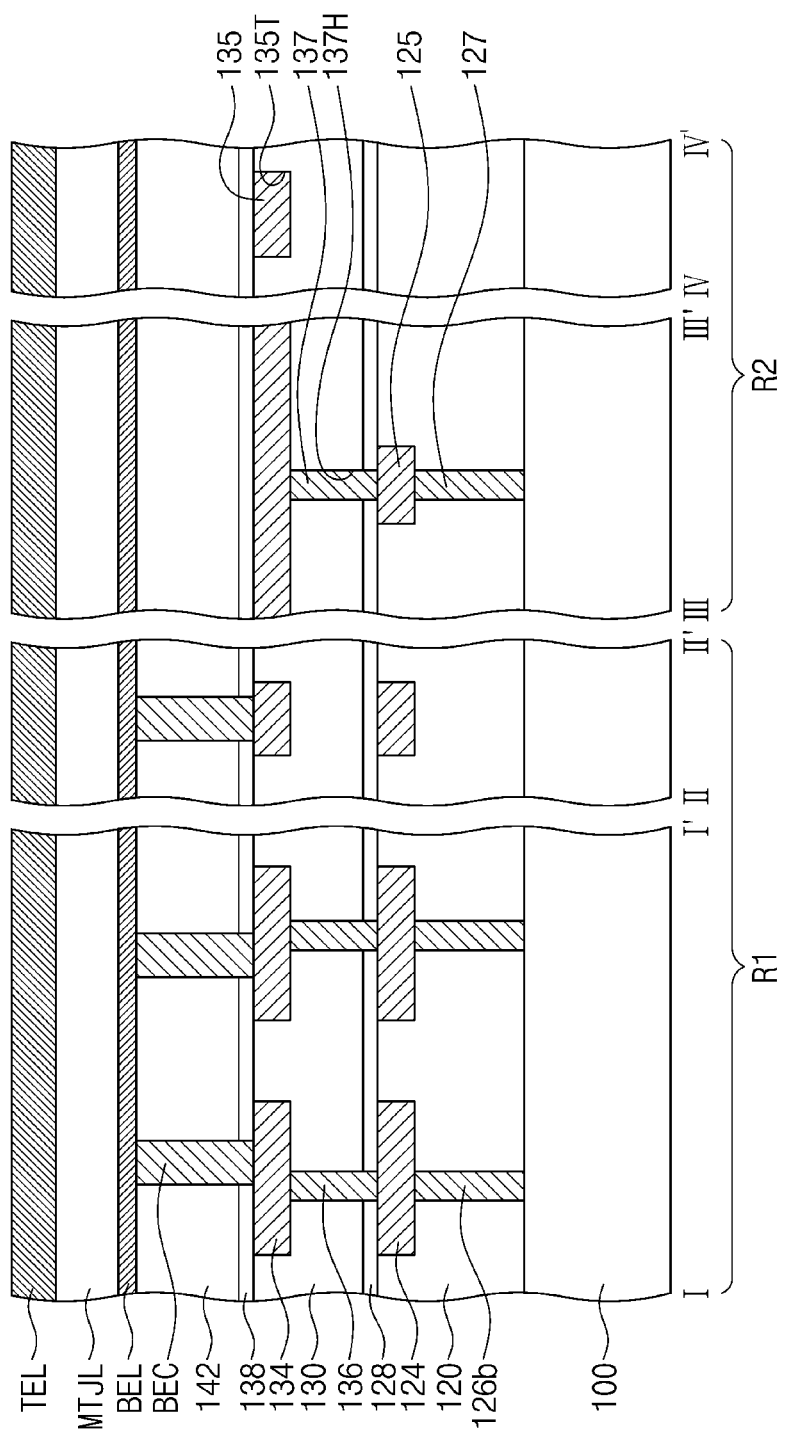

In FIGS. 9 and 11, a bottom electrode layer BEL, a magnetic tunnel junction layer MTJL, a top electrode layer TEL may be sequentially (or in the listed sequence, for example) formed on the substrate 100. For example, the magnetic tunnel junction layer MTJL may include a pinned layer, a tunnel barrier layer, and a free layer, which are sequentially stacked on the bottom electrode layer BEL. The bottom electrode layer BEL, the pinned layer, the tunnel barrier layer, the free layer, and the top electrode layer TEL may be respectively formed of the same materials as the bottom electrode BE, the pinned layer PL, the tunnel barrier layer TBL, the free layer FL, and the top electrode TE described with reference to FIGS. 2 to 4.

Figure 12:
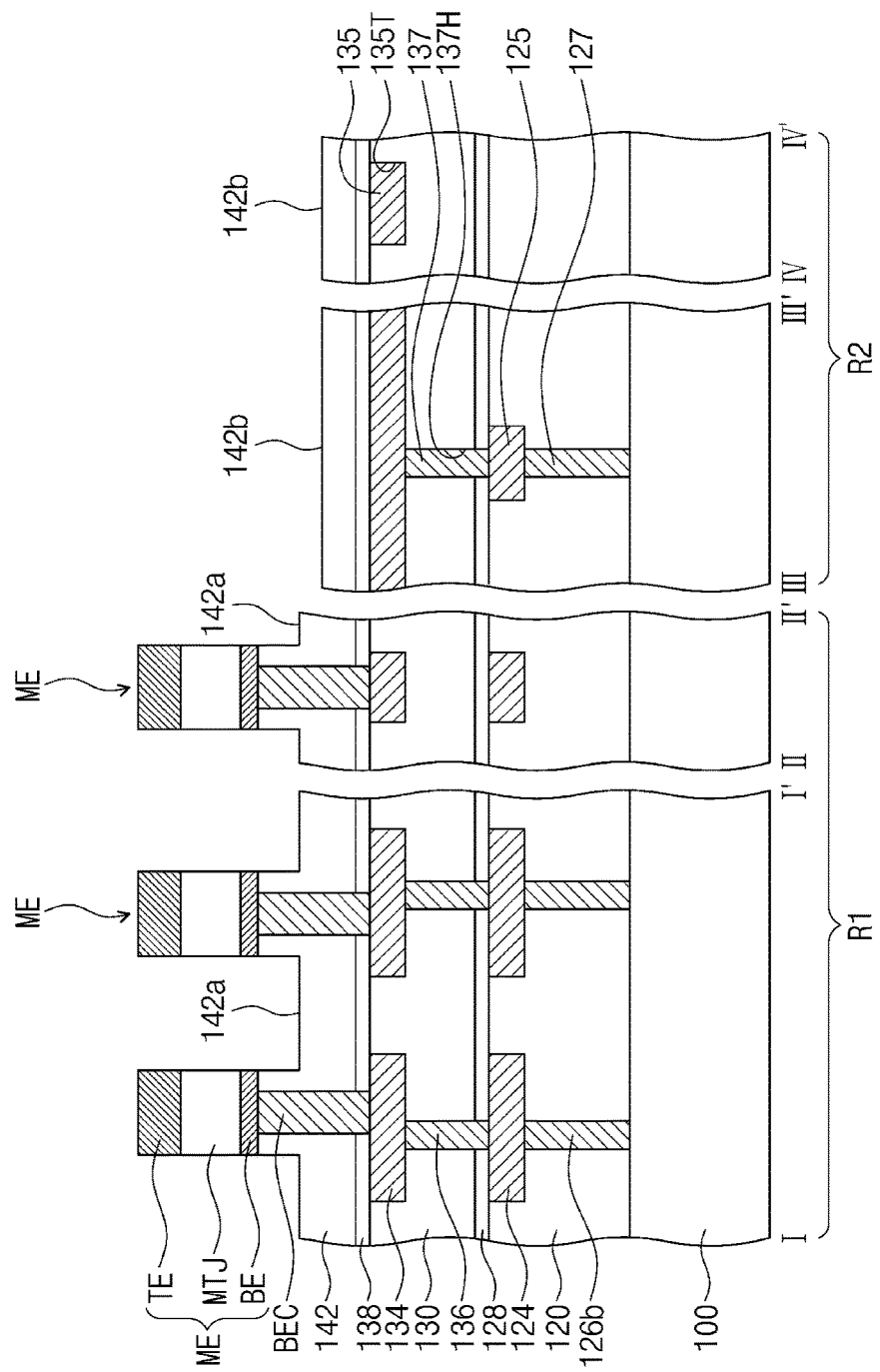

In FIGS. 9 and 12, the bottom electrode layer BEL, the magnetic tunnel junction layer MTJL, the top electrode layer TEL may be patterned to form the memory elements ME on the bottom electrode contacts BEC. Each of the memory elements ME may include the bottom electrode BE, the magnetic tunnel junction MTJ, and the top electrode TE, which are sequentially stacked on the bottom electrode contact BEC. The formation of the memory elements ME may include forming a mask pattern (not shown) on the top electrode layer TEL and performing an etching process using the mask pattern as an etch mask. The etching process may include, for example, an ion beam etching process. The ion beam etching process may be performed in such a way that an etch rate of the first mold insulating layer 142 containing an insulating material is higher than an etch rate of the magnetic tunnel junction layer MTJL containing a metallic material. Accordingly, exposed portions of the first mold insulating layer 142 around the magnetic tunnel junction MTJ may be recessed below the memory elements ME during the formation of the memory elements ME. Here, due to a difference in pattern density between the first and second regions R1 and R2, a recessed depth of the first mold insulating layer 142 may be larger on the second region R2 than on the first region R1. Thus, the first mold insulating layer 142 may have recessed top surfaces 142a and 142b whose heights are different from each other. For example, a height of the recessed top surface 142b of the first mold insulating layer 142 of the second region R2 may be lower than a height of the recessed top surface 142a of the first mold insulating layer 142 of the first region R1.

Referring to FIGS. 9 and 13-16, an upper conductive line 150 and an upper interconnection line 152 may be formed using a second design rule on the first region R1 and the second R2 of the substrate, respectively, according to an exemplary embodiment of the present inventive concept. (Step S130). According to an exemplary embodiment, the first design rule and the second design rule may include a width design rule of an conductive line, and the second design rule may be larger than the first design rule. For example, the second design rule may be at least about two times the first design rule. The difference in the design rules may provide a process margin to the ion beam etching process in which the memory elements ME are formed, as described above.

Figure 13:
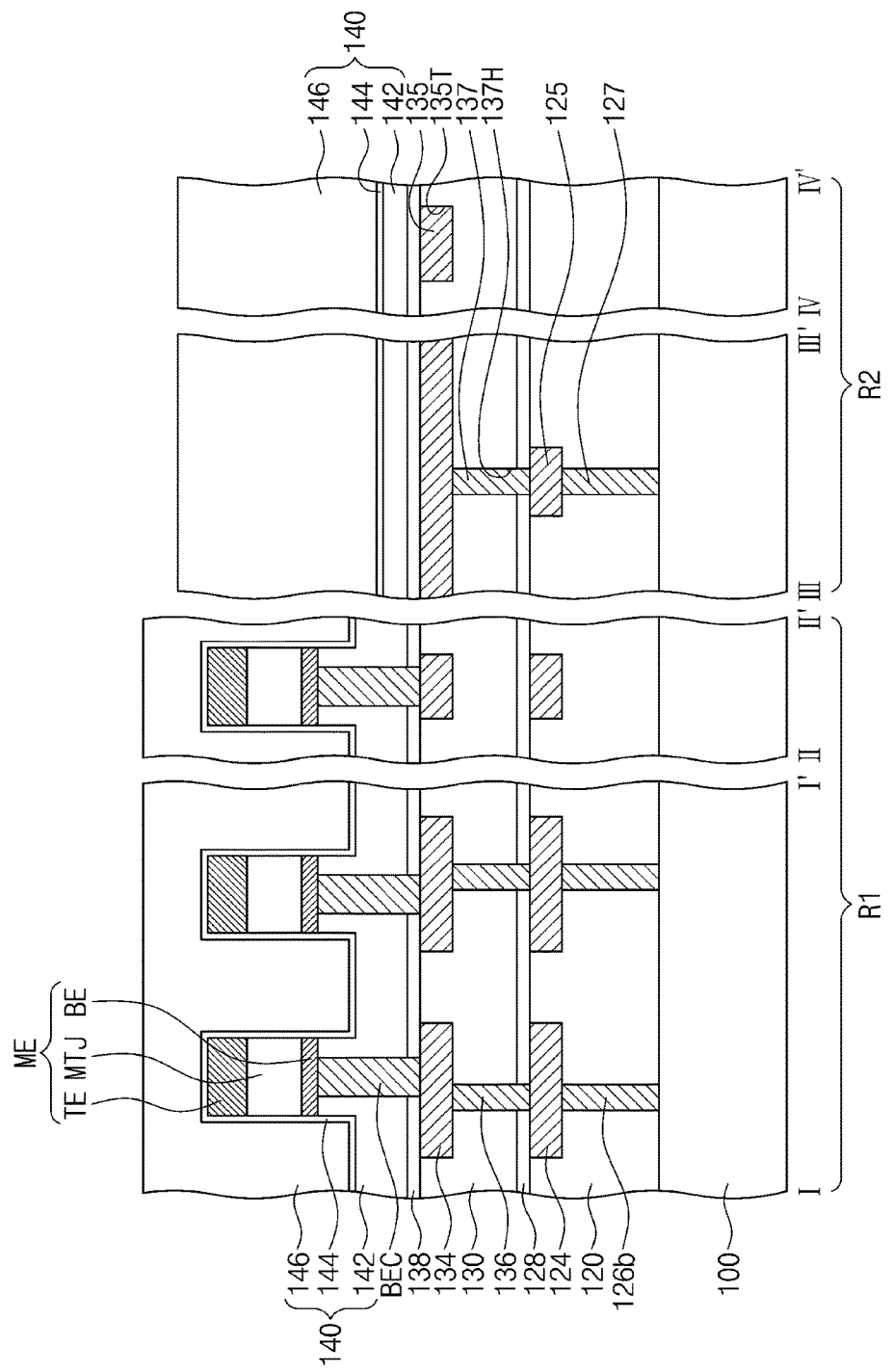

In FIGS. 9 and 13, the protection insulating layer 144 may be formed on the first mold insulating layer 142 to cover the top and side surfaces of the memory elements ME. The protection insulating layer 144 may be used to prevent the side surfaces of the magnetic tunnel junction MTJ from being oxidized in a subsequent process. For example, the protection insulating layer 144 may be formed of silicon nitride.

Next, the second mold insulating layer 146 may be formed. The second mold insulating layer 146 may be formed to fill a space between the memory elements ME and to cover the top surfaces of the memory elements ME. The second mold insulating layer 146 may be formed to have a planarized (i.e., flat) top surface. According to a height difference between the recessed top surfaces 142a and 142b of the first mold insulating layer 142, a top surface of the second mold insulating layer 146 of the second region R2 may be formed to have a height lower than a top surface of the second mold insulating layer 146 of the first region R1. The first mold insulating layer 142, the protection insulating layer 144, and the second mold insulating layer 146 may constitute the third interlayered insulating layer 140. In this case, the second etch stop layer 138 and the third interlayered insulating layer 140 may be referred to as an upper insulating layer.

Figure 14:
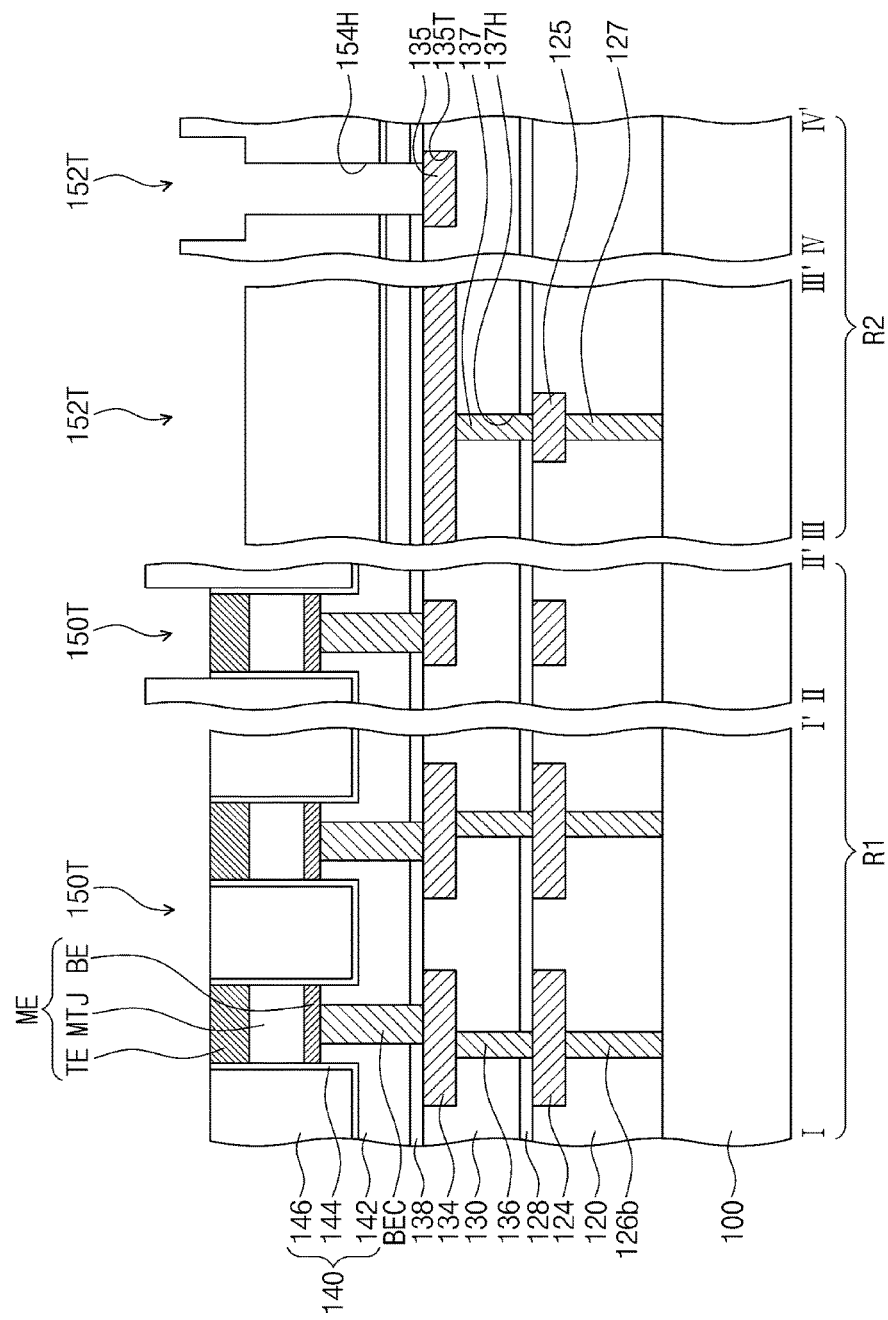

In FIGS. 9 and 14, a first trench 150T may be formed in the third interlayered insulating layer 140 of the first region R1, and a second trench 152T and a second peripheral via hole 154H may be formed in the third interlayered insulating layer 140 of the second region R2. The first trench 150T may be formed in the second mold insulating layer 146 of the first region R1 and may be formed to commonly expose the top surfaces of the plurality of the memory elements ME arranged in the first direction D1. The second trench 152T may be formed in the second mold insulating layer 146 of the second region R2 and may be formed to have the same vertical depth as the first trench 150T. The second peripheral via hole 154H may be formed to extend downward from a bottom surface of the second trench 152T and to expose a top surface of the first lower interconnection line 135.

Figure 15:
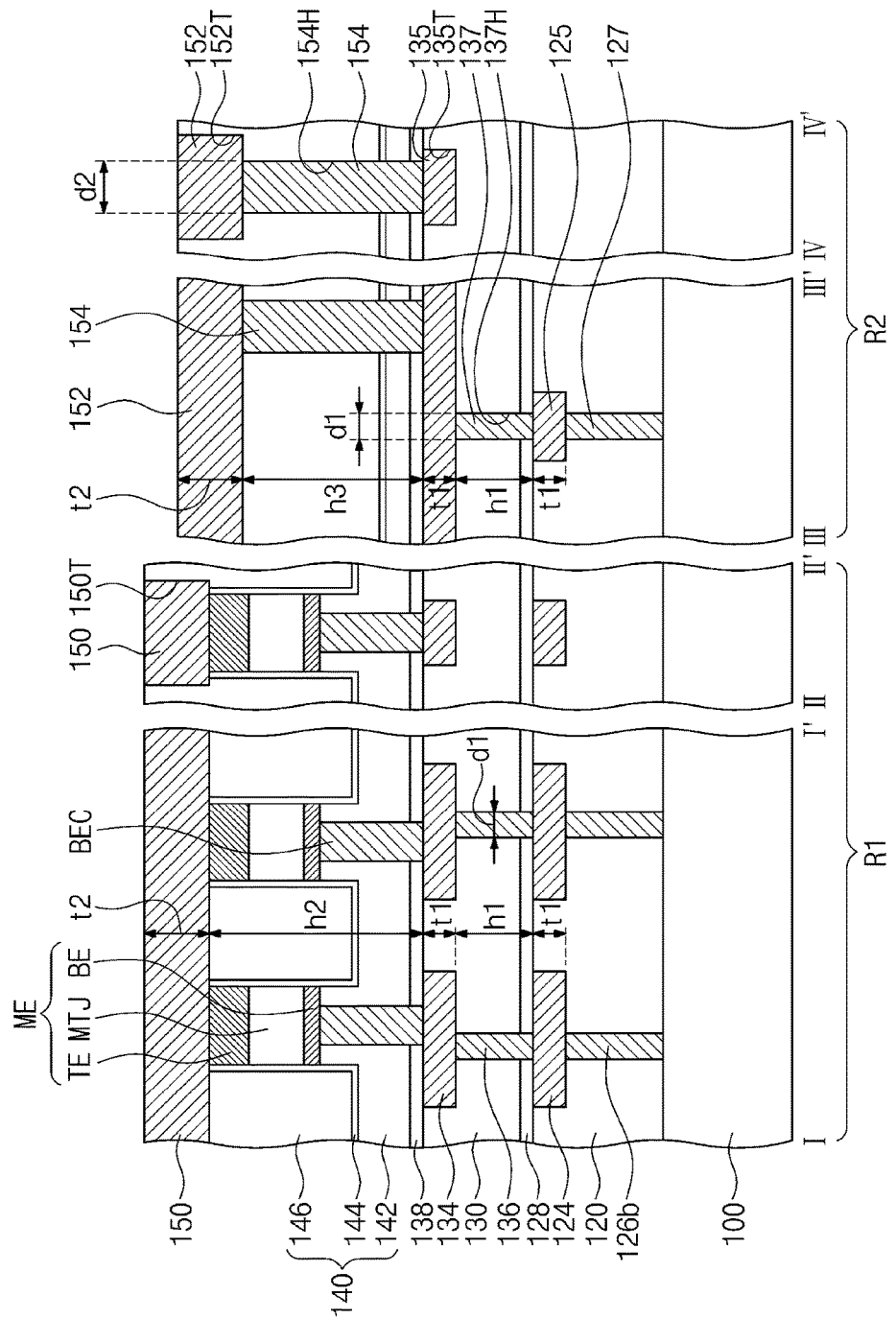
Figure 16:
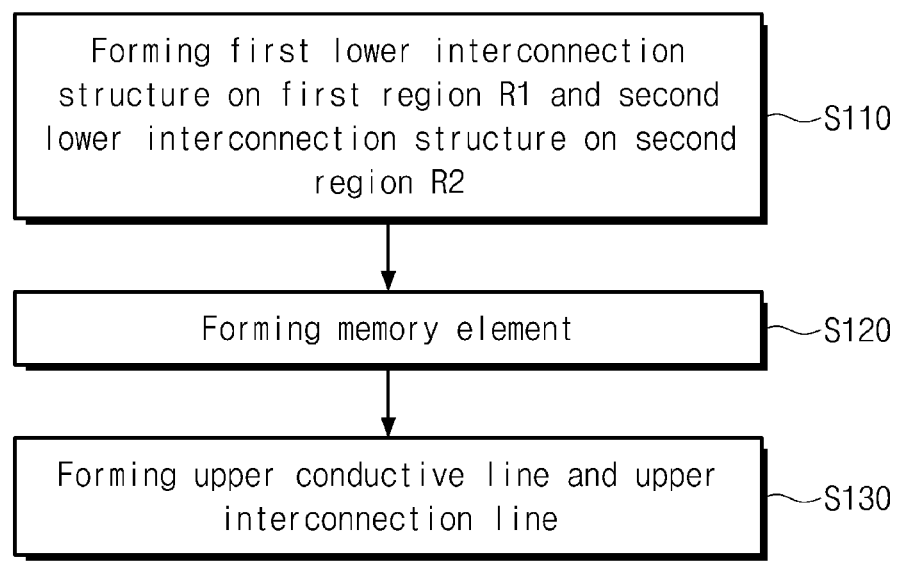
FIG. 16 is a flowchart of fabricating the semiconductor device of FIG. 9 according to an exemplary embodiment of the present inventive concept.

In FIGS. 9 and 15, the upper conductive line 150 may be formed by filling the first trench 150T with a conductive material, and an upper interconnection line 152 and a first peripheral via plug 154 may be formed by filling the second trench 152T and the second peripheral via hole 154H with a conductive material. The upper conductive line 150 and the upper interconnection line 152 may have second thicknesses t2, which correspond to vertical depths of the first and second trenches 150T and 152T. In addition, the upper conductive line 150 and the upper interconnection line 152 may have a second width W2 and a fifth width W5, respectively, when measured in a direction parallel to the second direction D2. The second width W2 and the fifth width W5 may be substantially equal to or different from each other. The first peripheral via plug 154 may have a second diameter d2, which corresponds to the diameter or width of the second peripheral via hole 154H, and a third height h3, which corresponds to the vertical length of the second peripheral via hole 154H. The third height h3 may be equal to a distance (to be referred to as 'a third distance h3') between the first lower interconnection line 135 and the upper interconnection line 152. For example, the third distance h3 may be a distance between a bottom surface of the upper interconnection line 152 and a top surface of the first lower interconnection line 135. The upper conductive line 150, the first peripheral via plug 154, and the upper interconnection line 152 may be formed of or include the same material (e.g., copper).

According to an exemplary embodiment of the inventive concept, the upper conductive line 150 and the upper interconnection line 152 may be formed under the second design rule defining increased feature sizes, compared with the first design rule. In an exemplary embodiment, the second thicknesses t2 of the upper conductive line 150 and the upper interconnection line 152 may be larger than the first thicknesses t1 of the lower conductive patterns 124 and 134 and the lower interconnection lines 125 and 135. For example, the second thicknesses t2 may be equal to or larger than about two times the first thicknesses t1. In addition, the widths W2 and W5 of the upper conductive line 150 and the upper interconnection line 152 may be larger than the widths W1 and W4 of the lower conductive patterns 124 and 134 and the lower interconnection lines 125 and 135. For example, the fifth width W5 may be about two times the fourth widths W4. Here, the minimums of the widths W2 and W5 that are allowed under the second design rule may be equal to or larger than about two times the minimums of the widths W1 and W4 that are allowed under the first design rule. Due to the different design rules, the second diameter d2 and the third height h3 of the first peripheral via plug 154 may be larger than the first diameter d1 and the first height h1, respectively, of the second peripheral via plug 137. For example, the second diameter d2 may be equal to or larger than about two times the first diameter d1, and the third height h3 may be equal to or larger than about two times the first height h1. The second distance h2 may be larger than the third distance h3. The first peripheral via plug 154 may have the diameter d2 larger than the diameter d1 of the second peripheral via plug 137.

Referring back to FIG. 12, during the etching of the magnetic tunnel junction layer MTJL, a conductive etch residue may be produced and may be re-deposited on the side surface of the magnetic tunnel junction MTJ. The re-deposited conductive etch residue may result in a short circuit between magnetic layers. To remove the conductive etch residue re-deposited on the side surface of the magnetic tunnel junction MTJ, it may be necessary to sufficiently perform the ion beam etching process. For example, the ion beam etching process may performed after the magnetic tunnel junction MTJ is formed, and thus the recessed top surfaces 142a and 142b are formed by over-etching the first mold insulating layer 142. In this case, the first mold insulating layer 142 may be excessively etched so that the top surface of the first mold insulating layer 142 may be recessed to form the recessed top surface 142a. The over-etching of the first mold insulating layer 142 may lead to an unintended exposure or etch damage of the first lower conductive patterns 134 or the first lower interconnection line 135. To avoid this issue, it may be necessary to increase a thickness of the first mold insulating layer 142 or to increase a vertical length of the bottom electrode contact BEC.

In an exemplary embodiment, the recessed top surface 142a may be lower than the bottom surface of the bottom electrode BE and higher than a bottom surface of the bottom electrode contact BEC. The bottom surface of the bottom electrode contact BEC may be in direct contact with the first lower conductive pattern 134.

In FIG. 12, a portion of the top surface of the first mold insulating layer 142 may be recessed in the ion beam etching process so that the first mold insulating layer 142 has the recessed top surface 142a lower than the bottom surface of the bottom electrode BE.

If the upper conductive line 150 and the upper interconnection lines 152 may be formed under the same design rule as the design rule for the lower conductive patterns 124 and 134 and the lower interconnection lines 125 and 135 (i.e., under the first design rule), the first peripheral via plug 154 may be formed to have the same diameter and height as the diameter and height of the second peripheral via plug 137 (i.e., the first diameter d1 and the first height h1). In this case, the over-etching of the first mold insulating layer 132 may lead to etch damage of the first lower conductive patterns 134 or the first lower interconnection line 135. Here, to prevent the above over-etching issue of the first mold insulating layer 142, the first mold insulating layer 142 may be formed to have an increased thickness, but in this case, it is necessary to increase the vertical length of the first peripheral via plug 154. If the vertical length (i.e., the height) of the first peripheral via plug 154, which is formed to have the first diameter d1 under the first design rule, is increased, a process difficulty in a gap-filling process may be increased, and this may lead to a reduction in process margin of the gap-filling process. If the height of the first peripheral via plug 154 is maintained to secure a process margin in the gap-filling process, it is necessary to form an additional conductive pad below the first peripheral via plug 154, and this may lead to an increase in fabrication cost. Furthermore, the increase in thickness of the first mold insulating layer 142 may result in a change in the distance and capacitance between the upper interconnection line 152 and the first lower interconnection line 135, which is required under the first design rule.

By contrast, according to an exemplary embodiment of the inventive concept, the upper conductive line 150, the upper interconnection line 152, and the first peripheral via plug 154 may be formed under the second design rule defining increased feature sizes, compared with the first design rule, and in this case, it may be possible to secure a sufficient thickness of the first mold insulating layer 142 and thereby to prevent the above issues, which may be caused by the over-etching of the first mold insulating layer 142 in the ion beam etching process. In addition, there may be no need to further increase the height of the first peripheral via plug 154, and thus, it may be possible to form the memory elements ME, without any additional process or deterioration in electric characteristics of a semiconductor device. Accordingly, it may be possible to fabricate a highly-reliable semiconductor device using a simple process.

According to an exemplary embodiment of the inventive concept, an upper conductive line on a memory element may be formed to have an increased design rule, compared with lower conductive patterns below the memory element. Accordingly, it may be possible to form the memory element, while minimizing a change in a logic process (e.g., a process for forming interconnection lines in a logic structure). In addition, it may be possible to prevent process failure from occurring during the formation of the memory element, without any additional process. Accordingly, it may be possible to fabricate a highly-reliable semiconductor device using a simple process.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:
1. A semiconductor device, comprising:
a substrate;
a plurality of lower conductive patterns stacked vertically on the substrate to be vertically spaced apart from each other at a first distance;
a magnetic tunnel junction stacked vertically on an uppermost lower conductive pattern of the plurality of lower conductive patterns;
an upper conductive line provided on the magnetic tunnel junction;
a bottom electrode contact between the magnetic tunnel junction and an uppermost lower conductive pattern of the plurality of lower conductive patterns; and
a top electrode between the magnetic tunnel junction and the upper conductive line,
wherein the upper conductive line is in direct contact with the top electrode,
wherein the bottom electrode contact is in direct contact with the uppermost lower conductive pattern,
wherein the uppermost lower conductive pattern has a first thickness and a first width,
wherein the upper conductive line has a second thickness larger than the first thickness of the uppermost lower conductive pattern and a second width larger than the first width of the uppermost lower conductive pattern, and
wherein a second distance between the upper conductive line and the uppermost lower conductive pattern is larger than the first distance.
2. The semiconductor device of claim 1,
wherein the second thickness is about two times the first thickness.
3. The semiconductor device of claim 1,
wherein the second distance is equal to or larger than about two times the first distance.
4. The semiconductor device of claim 1,
wherein each of the plurality of lower conductive patterns has substantially the same thickness.
5. The semiconductor device of claim 1,
wherein the substrate includes an active portion, and
wherein the semiconductor device further comprises:
a pair of word lines on the active portion of the substrate;

a first impurity region provided in the active portion of the substrate and between one of the pair of word lines and the other of the pair of word lines; and
second impurity regions provided in the active portion of the substrate and outside the pair of word lines,
wherein the magnetic tunnel junction is electrically connected to one of the second impurity regions through the plurality of lower conductive patterns.

6. The semiconductor device of claim 5, further comprising:
a lower conductive line having a top surface located at substantially the same height as a top surface of one of the plurality of lower conductive patterns from the substrate,
wherein the lower conductive line is electrically connected to the first impurity region.

7. The semiconductor device of claim 6,
wherein a thickness of the lower conductive line is less than the second thickness, and
wherein a width of the lower conductive line is less than the second width.

8. The semiconductor device of claim 1,
wherein the substrate comprises a first region and a second region, and
wherein the magnetic tunnel junction is provided on the first region,
wherein the semiconductor device further comprises:
a first lower interconnection line provided on the substrate of the second region,
the first lower interconnection line having a top surface that is located at substantially the same height as a top surface of the uppermost lower conductive pattern; and
an upper interconnection line provided on the first lower interconnection line,
wherein a thickness of the first lower interconnection line is substantially the same as the first thickness of the uppermost lower conductive pattern, and
wherein a thickness of the upper interconnection line is substantially the same as the second thickness of the upper conductive line.

9. The semiconductor device of claim 8,
wherein a third distance between the first lower interconnection line and the upper interconnection line is larger than the first distance and is less than the second distance.

10. The semiconductor device of claim 9,
wherein the third distance is about two times the first distance.

11. The semiconductor device of claim 8,
wherein the semiconductor device further comprises:
a second lower interconnection line provided below the first lower interconnection line;
a first peripheral via plug provided between the upper interconnection line and the first lower interconnection line; and
a second peripheral via plug provided between the first lower interconnection line and the second lower interconnection line,
wherein the first peripheral via plug has a diameter larger than a diameter of the second peripheral via plug.

12. The semiconductor device of claim 11,
wherein a height of the first peripheral via plug is larger than a height of the second peripheral via plug.

13. The semiconductor device of claim 12,
wherein the height of the first peripheral via plug is about two times the height of the second peripheral via plug.

14. The semiconductor device of claim 1,
wherein an entire upper surface of the top electrode is in direct contact with the upper conductive line.

15. A semiconductor device, comprising:
a substrate including a first region and a second region;
a first lower conductive pattern and a first lower interconnection line provided on the first region and the second region, respectively, the first lower conductive pattern and the first lower interconnection line having top surfaces located at substantially the same height from the substrate;
an upper conductive line and an upper interconnection line provided on the first lower conductive pattern and the first lower interconnection line, respectively;
a magnetic tunnel junction provided between the first lower conductive pattern and the upper conductive line;
a bottom electrode contact between the magnetic tunnel junction and the first lower conductive pattern,
wherein an upper surface of the upper conductive line is higher than an upper surface of the upper interconnection line from the substrate,
wherein the magnetic tunnel junction, the bottom electrode contact and the first lower conductive pattern are vertically aligned; and
a first peripheral via plug provided between the lower first interconnection line and the upper interconnection line,
wherein thicknesses of the upper conductive line and the upper interconnection line are larger than thicknesses of the first lower conductive pattern and the first lower interconnection line, and
wherein widths of the upper conductive line and the upper interconnection line are larger than widths of the first lower conductive pattern and the first lower interconnection line.

16. The semiconductor device of claim 15,
wherein a distance between the first lower conductive pattern and the upper conductive line is larger than a distance between the first lower interconnection line and the upper interconnection line.

17. The semiconductor device of claim 16,
wherein the semiconductor device further comprises:
a second lower conductive pattern provided below the first lower conductive pattern; and
a second lower interconnection line provided below the first lower interconnection line,
wherein the second lower conductive pattern and the second lower interconnection line have top surfaces located at substantially the same height from the substrate, and
wherein a distance between the first lower interconnection line and the second lower interconnection line is less than the distance between the first lower interconnection line and the upper interconnection line.

18. The semiconductor device of claim 17,
wherein the semiconductor device further comprises:
a cell via plug provided between the first lower conductive pattern and the second lower conductive pattern; and
a second peripheral via plug provided between the first lower interconnection line and the second lower interconnection line,
wherein the first peripheral via plug has a diameter larger than a diameter of the cell via plug and a diameter of the second peripheral via plug.

19. The semiconductor device of claim 17,
wherein the first region of the substrate includes an active portion, wherein the semiconductor device further comprises:
a pair of word lines provided on the active portion of the first region of the substrate;
a first impurity region provided in the active portion of the first region of the substrate and between one of the pair of word lines and the other of the pair of word lines; and
second impurity regions provided in the active portion of the substrate and outside the pair of word lines, and
wherein the magnetic tunnel junction is electrically connected to one of the second impurity regions.

20. The semiconductor device of claim 19, further comprising:
a lower conductive line electrically connected to the first impurity region,
wherein the lower conductive line has substantially the same thickness as the second lower conductive pattern.

* * * * *